US010130019B2

(12) United States Patent
Tsuge et al.

(10) Patent No.: US 10,130,019 B2
(45) Date of Patent: Nov. 13, 2018

(54) FEEDER COMPONENT TYPE DETERMINATION METHOD AND FEEDER COMPONENT TYPE DETERMINATION DEVICE

(71) Applicant: FUJI CORPORATION, Chiryu (JP)

(72) Inventors: Kuniaki Tsuge, Chiryu (JP); Naoko Narita, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 33 days.

(21) Appl. No.: 14/913,139

(22) PCT Filed: Aug. 21, 2013

(86) PCT No.: PCT/JP2013/072299
§ 371 (c)(1),
(2) Date: Feb. 19, 2016

(87) PCT Pub. No.: WO2015/025383
PCT Pub. Date: Feb. 26, 2015

(65) Prior Publication Data
US 2016/0212897 A1    Jul. 21, 2016

(51) Int. Cl.
H05K 13/08       (2006.01)
H05K 13/04       (2006.01)

(52) U.S. Cl.
CPC ......... H05K 13/08 (2013.01); H05K 13/0417 (2013.01)

(58) Field of Classification Search
CPC ........................... H05K 13/08; H05K 13/0417
(Continued)

(56) References Cited

U.S. PATENT DOCUMENTS 5,339,939 A * 8/1994 Gueble .................. B23Q 16/00
                                                                198/345.2
6,161,277 A * 12/2000 Asai ....................... H05K 13/08
                                                                198/586
(Continued)

FOREIGN PATENT DOCUMENTS

JP          2004-140162 A       5/2004
JP          2009-123692 A       6/2009
(Continued)

OTHER PUBLICATIONS

International Search Report dated Sep. 24, 2013, in PCT/JP2013/072299 Filed Aug. 21, 2013.

Primary Examiner — Patrick H Mackey
(74) Attorney, Agent, or Firm — Oblon, McClelland, Maier & Neustadt, L.L.P.

(57) ABSTRACT

A feeder component type determination method which determines combinations of a plurality of tape feeders and a plurality of component types of components which are stored in carrier tapes in a component mounting machine provided with a component supply device equipped, in a detachable manner, with the plurality of tape feeders each of which holds a carrier tape and sequentially supplies the components, and a component transfer device which sucks the component in a supply position and mounts the component to a printed circuit board, and the method includes measuring a positional precision for at least a portion of the tape feeders, determining the combinations of the tape feeders and the component types based on the positional precision of the tape feeders and at least one of component external dimensions which are determined according to the component type of the components and an allowable positional precision.

12 Claims, 7 Drawing Sheets

(58) Field of Classification Search
USPC .......................................................... 700/226
See application file for complete search history.

(56) References Cited

U.S. PATENT DOCUMENTS

| | | | | |
|---|---|---|---|---|
| 6,640,431 B1 * | 11/2003 | Yoriki | ................ | H05K 13/0408 |
| | | | | 29/703 |
| 6,941,646 B2 * | 9/2005 | Suhara | ............... | H05K 13/0069 |
| | | | | 29/739 |
| 7,073,696 B2 * | 7/2006 | College | ............. | H05K 13/0417 |
| | | | | 226/139 |
| 7,181,307 B2 * | 2/2007 | Kodama | ........... | H05K 13/0452 |
| | | | | 700/121 |
| 7,245,978 B2 * | 7/2007 | Kodama | .............. | G06Q 10/087 |
| | | | | 700/100 |
| 7,273,166 B2 * | 9/2007 | Suhara | ............... | H05K 13/0417 |
| | | | | 235/376 |
| 9,669,980 B2 * | 6/2017 | Koyanagi | ............ | B65D 75/327 |

FOREIGN PATENT DOCUMENTS

| | | | |
|---|---|---|---|
| JP | 2010-073929 A | | 4/2010 |
| JP | 2010073929 A | * | 4/2010 |

* cited by examiner

FIG. 8

| TAPE FEEDER | COMPONENT TYPE / ALLOWABLE POSITION ERROR (POSITIONAL PRECISION) | MEDIUM (TAPE WIDTH W1) | | | | MINUTE (TAPE WIDTH W2) | | | |
|---|---|---|---|---|---|---|---|---|---|
| | | P1 | P2 | P3 | P4 | P5 | P6 | P7 | P8 |
| | | — | — | — | — | Av5 | Av6 | Av7 | Av8 |
| MEDIUM COMPONENTS (TAPE WIDTH W1) | F1 — | ◯ | ◯ | ◯ | ◯ | | | | |
| | F2 — | ◯ | ◯ | ◯ | ◯ | | | | |
| | F3 — | ◯ | ◯ | ◯ | ◯ | | | | |
| | F4 — | ◯ | ◯ | ◯ | ◯ | | | | |
| MINUTE COMPONENTS (TAPE WIDTH W2) | F5 Er5 | | | | | ◉ | ◯ | × | × |
| | F6 Er6 | | | | | ◯ | ◉ | ◯ | ◯ |
| | F7 Er7 | | | | | ◯ | ◯ | ◉ | ◯ |
| | F8 Er8 | | | | | ◯ | ◯ | ◯ | ◉ |

WHERE Av5 > Av6 > Er5 > Av7 > Av8 > Er6 > Er7 > Er8

FEEDER COMPONENT TYPE DETERMINATION METHOD AND FEEDER COMPONENT TYPE DETERMINATION DEVICE

TECHNICAL FIELD

The present disclosure relates to a tape feeder which forms a component supply device of a component mounting machine, and, more specifically, relates to a method of determining a combination of a plurality of tape feeders and a plurality of component types of the components which are stored in carrier tapes which are loaded into the tape feeders, and relates to a device which determines the combination.

BACKGROUND ART

As a device which produces printed circuit boards on which multiple components are mounted, there is a solder printer, a component mounting machine, a reflow furnace, a printed circuit board tester, and the like, and these are often linked to construct a printed circuit board production line. Of these, the component mounting machine is generally provided with a board conveyance device, a component supply device, and a component transfer device. The board conveyance device performs the carrying-in, carrying-out, and the positioning of the printed circuit board. The component supply device sequentially supplies components of a plurality of component types to a predetermined supply position. A feeder system component supply device is a representative example of the component supply device. The feeder system component supply device is generally equipped with a plurality of tape feeders in a detachable manner. Each tape feeder holds a carrier tape in which a plurality of components are stored at an equal pitch, and sequentially supplies the components to the supply position. The component transfer device sucks to the component from the supply position of the component supply device using a negative pressure and mounts the component on a positioned printed circuit board.

Regarding the feeder system component supply device described above, the specifications such as the width dimension of the carrier tape and the inter-component pitch dimension are defined in levels by the JIS standard and the like based on the size and the like of the component. Although it is preferable that the feed amount by which the tape feeder intermittently feeds the carrier tape ideally matches the pitch dimension, these do not necessarily strictly match every time and may fluctuate. The fluctuation of the feed amount is directly linked to the positional precision of the supply position at which the components are actually transferred. The positional precision of the supply position of the tape feeder is generally managed such that a suction nozzle of the component transfer device can stably suck the component.

However, individual differences in the positional precision of the tape feeders cannot be avoided, even if the same type of tape feeder which uses the same specification of carrier tape is used. In addition, it is conceivable that the positional precision decreases with the passage of time due to the wearing or the like of the drive sections caused by operation over many years. The decrease in the positional precision leads to a suction fault in which the suction nozzle cannot suck the component. Decreases in the production efficiency and the like caused by the wasting of components and a recovery operation occur due to the suction faults. Due to tape feeders with reduced positional precision also being present, the operational efficiency of the set-up work and the like is reduced, and the production efficiency is further reduced.

The applicant of the present application has disclosed a maintenance method which handles this reduction in the positional precision of the tape feeder in PTL 1. The maintenance method of the electronic circuit component mounting machine of PTL 1 intensively performs maintenance on the constituent elements of a plurality of electronic circuit component mounting machines which are installed in a plurality of factories. The constituent elements include a component feeder (the tape feeder), and, for example, a plurality of electronic circuit component mounting machines is monitored intensively in real time by a single monitoring system. Accordingly, it is possible to intensively perform the maintenance of the component feeder for which the necessity to perform maintenance arises easily due to frequent operation causing great degradation and wearing, there being many component feeders of many types. Although spare component feeders are necessary in order to avoid a reduction in the availability factor of the electronic circuit component mounting machine, it is possible to reduce the number of spares to be kept.

CITATION LIST

Patent Literature

PTL 1: JP-A-2004-140162

SUMMARY

Technical Problem

Incidentally, in recent times, there has been progress in the reduction in the size and the increase in functionality of electronic circuits, as represented by smart phones, and there is an extreme reduction in the size of the components which are used. For example, for chip components such as chip resistors and chip capacitors, minute components with component external dimensions of 0.2×0.1 (mm), 0.3×0.15 (mm), 0.4×0.2 (mm), and the like are starting to come into use. In a tape feeder which supplies such minute components, there is a concern that suction faults will occur frequently if the precision management of the supply position is not performed more strictly than in the related art. Therefore, the maintenance technique of the related art exemplified in PTL 1 is insufficient, and it is considered to be preferable to determine the combination of the tape feeders and the component type of the carrier tape to be loaded in consideration of influences such as the individual differences between the positional precision of the individual tape feeders and degradation with the passage of time.

The present disclosure was made in light of the problems of the background art described above, and aims to solve the problem of providing a feeder component type determination method and a feeder component type determination device in which the suction operation of the components is stable and the production efficiency of the printed circuit boards is increased by determining the combinations of the tape feeders and the component types of the components which are stored in the carrier tape to be loaded in consideration of influences such as the individual differences between the positional precision of the supply positions of a plurality of tape feeders which supply minute components and the like and degradation with the passage of time.

Solution to Problem

A feeder component type determination method of the present disclosure which solves the problem determines combinations of a plurality of tape feeders and a plurality of component types of components which are stored in carrier tapes in a component mounting machine provided with a component supply device equipped, in a detachable manner, with the plurality of tape feeders each of which holds a carrier tape in which the plurality of components is stored at an equal pitch and sequentially supplies the components to a corresponding supply position, and a component transfer device which sucks the component which is supplied to the supply position and mounts the component to a printed circuit board which is positioned in a mount-execution position, and the feeder component type determination method includes a positional precision measurement step of measuring a positional precision at the supply position for at least a portion of the tape feeders, and a component type determination step of determining the combinations of the tape feeders and the component types of the components which are stored in the carrier tapes based on the positional precision of the tape feeders and at least one of component external dimensions which are determined according to the component type of the components and an allowable positional precision when the components are supplied to the supply position by the tape feeder.

Effects

In the feeder component type determination method of the present disclosure, in the positional precision measurement step, since the positional precision at the supply position is measured for at least a portion of the tape feeders, it is possible to individually and accurately ascertain the influence of individual differences in the positional precision, degradation with the passage of time, and the like. In the component type determination step, combinations of the tape feeders and the component types of the components which are stored in the carrier tapes are determined based on the positional precision of the tape feeders and at least one of the component external dimensions and the allowable positional precision which are determined according to the component type of the components. Therefore, it is possible to suppress the occurrence of suction faults in relation to minute components which have a strict allowable positional precision, and the production efficiency of the printed circuit boards can be increased.

BRIEF DESCRIPTION OF DRAWINGS

FIG. 8 is a diagram of a combination table of tape feeders and component types explaining the operations of the feeder component type determination method of the embodiment by exemplification.

DESCRIPTION OF EMBODIMENTS

Figure 1:
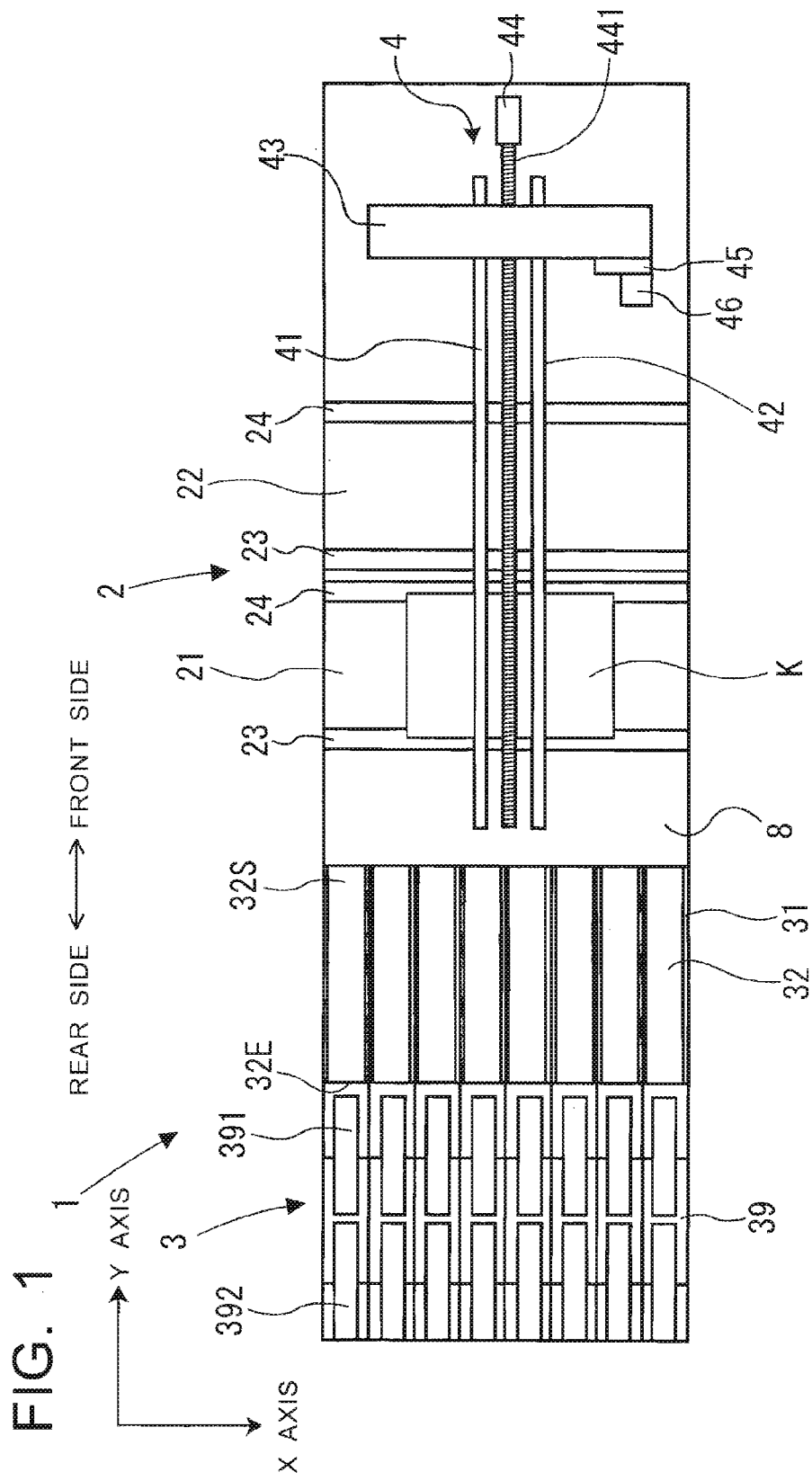
FIG. 1 is a plan view illustrating a configuration example of a component mounting machine which performs a feeder component type determination method of an embodiment.

Description will be given of the feeder component type determination method of the embodiment of the present disclosure with reference to FIG. 1 to FIG. 9. First, description will be given of a configuration example of a component mounting machine 1 capable of performing the feeder component type determination method of the embodiment. FIG. 1 is a plan view illustrating the configuration example of the component mounting machine 1 which performs the feeder component type determination method of the embodiment. The component mounting machine 1 is formed by a board conveyance device 2, a component supply device 3, a component transfer device 4, a control computer which is not depicted in the drawings, and the like being assembled onto a device table 8. The up-down directions of the paper surface of FIG. 1 are the X-axis directions in which a printed circuit board K is conveyed, and the left-right directions of the paper surface, that is, the longitudinal directions of the component mounting machine 1 are the Y-axis directions.

The board conveyance device 2 is a dual lane type device capable of conveying two of the printed circuit boards K in parallel. The board conveyance device 2 carries the printed circuit boards K into a mount-execution position in each of a first lane 21 and a second lane 22, which are provided in parallel, positions the printed circuit boards K, and carries the printed circuit boards K out. The first lane 21 and the second lane 22 are each formed by a pair of guide rails 23 and 24, a pair of conveyor belts, a clamp device, and the like. The pair of guide rails 23 and 24 is assembled onto the center of the top portion of the device table 8 to extend in the conveyance directions (the X-axis directions) of the printed circuit board K such that the guide rails 23 and 24 are parallel to each other. A pair of endless band-shaped conveyor belts which is omitted from the drawings is provided between the pair of guide rails 23 and 24, the conveyor belts being arranged parallel to each other. The pair of conveyor belts rotate in a state in which the printed circuit board K is placed on conveyor conveyance surfaces, and perform the carrying-in and carrying-out of the printed circuit board K to the mount-execution position which is set to the center portion of the device table 8.

A clamp device which is omitted from the drawings is provided below the conveyor belt of the mount-execution position. The clamp device pushes the printed circuit board K up from the conveyor belts, clamps the printed circuit board K in a horizontal orientation, and positions the printed circuit board K in the mount-execution position. Accordingly, the component transfer device 4 can perform the mounting operation in the mount-execution position. In FIG. 1, a condition is exemplified in which the printed circuit board K is carried in and is positioned in the mount-execution position in the first lane 21, and, in the second lane 22, the printed circuit board K is not carried in.

The component supply device 3 is formed of a support table 31, eight tape feeders 32, and eight reel holding sections 39, and supplies a maximum of eight component types of a component P. The eight tape feeders 32 is an example to facilitate the explanation hereinafter, and in actuality, a component supply device is generally equipped with more than eight of the tape feeders 32 and is capable of supplying more component types. The support table 31 is a substantially rectangular member, and the width direction dimension (the X-axis direction dimension) is approximately equal to the width dimension of the device table 8. Eight slots are formed in the top surface of the support table 31 to line up in the width directions (the X-axis directions) extending in the longitudinal directions (the Y-axis directions). The support table 31 is equipped to the top surface of the rear side of the device table 8 in a detachable manner (refer to FIG. 5).

The tape feeder 32 is a flat shape which is long in the up-down directions and the forward-backward directions, and narrow in the width directions. The eight tape feeders 32 are equipped by being inserted into the eight slots of the support table 31 from the rear side, and are used lined up in the X-axis directions. Each of the eight reel holding sections 39 is used equipped to the rear side of the tape feeder 32 with which the reel holding section 39 forms a pair. The reel holding section 39 holds a first reel 391 and a second reel 392 lined up to the front and the rear (the Y-axis directions) to be exchangeable. Carrier tapes 5 in which multiple components P are stored at an equal pitch Lp are wound on the first reel 391 and the second reel 392. A component type specification code, which specifies the component type, the manufacturer, and the like of the components P which are stored in the wound carrier tape 5, is attached to the side surface of the first reel 391 and the second reel 392. A bar-code can be given as an example of the component type specification code, and the configuration is not limited thereto. Note that, it is possible to prepare more than eight of the tape feeders 32 in advance, and use the tape feeders 32 by exchanging them.

Each of the tape feeders 32 of the component supply device 3 is capable of inserting and loading the tip of the carrier tape 5 which is wound on each of the first reel 391 and the second reel 392 from an insertion port 32E. Each of the tape feeders 32 supplies the component P to a supply position 32S of the tip by intermittently feeding one of the carrier tapes 5 by the predetermined pitch Lp at a time. When one of the carrier tapes 5 is used up, each of the tape feeders 32 automatically starts feeding the other carrier tape 5. Accordingly, in the reel holding section 39, the reel which is wound on one of the carrier tapes 5 is removed, and it becomes possible to hold a third reel (omitted from the drawings) which is wound on a third carrier tape 5. Description will be given of the detailed structures of the carrier tape 5 and the tape feeder 32 later.

The component transfer device 4 sucks the component from the supply position 32S of the tape feeder 32 of the component supply device 3, conveys the component to the printed circuit board K which is positioned in the mount-execution position and mounts the component thereon. The component transfer device 4 is an XY robot type of device capable of horizontal movement in the X-axis directions and the Y-axis directions. The component transfer device 4 is formed of a pair of Y-axis rails 41 and 42, a Y-axis slider 43, a Y-axis servo motor 44, an X-axis slider 45, an X-axis servo motor which is omitted from the drawings, a mounting head 46, a suction nozzle which is omitted from the drawings, and the like.

A Y-axis drive robot is formed of the pair of Y-axis rails 41 and 42, the Y-axis slider 43, the Y-axis servo motor 44, and the like. The pair of Y-axis rails 41 and 42 are installed to run parallel from the front side in the longitudinal directions of the device table 8, through the space above the positioned printed circuit board K, to the top of the component supply device 3 of the rear side. The Y-axis slider 43 bridges over the Y-axis rails 41 and 42 to be capable of moving. The Y-axis slider 43 is driven in the Y-axis direction by a ball screw mechanism which includes a ball screw 441 which is joined to the output shaft of the Y-axis servo motor 44.

An X-axis drive robot is formed of the X-axis slider 45, the X-axis servo motor, and the like. The X-axis slider 45 bridges to be capable of moving over one side surface which extends in the X-axis directions of the Y-direction slider 43. The X-axis servo motor which is omitted from the drawings is installed on the Y-axis slider 43. The X-axis slider 45 is driven in the X-axis directions by a ball screw mechanism which includes a ball screw which is joined to the output shaft of the X-axis servo motor.

The mounting head 46 is installed on the side surface of the X-axis slider 45 to be exchangeable. A plurality of suction nozzles which are not visible in the drawing are held on the bottom side of the mounting head 46 to be detachable. When the suction nozzle is driven to the supply position 32S of the tape feeder 32 by the X-axis drive robot and the Y-axis drive robot, the suction nozzle sucks the component P of the supply position 32S using a negative pressure. Next, when the suction nozzle is driven to the printed circuit board K which is positioned by the X-axis drive robot and the Y-axis drive robot, the suction nozzle mounts the component P on the printed circuit board K.

A control computer which is omitted from the drawings controls the production operations of the printed circuit board K and manages the production conditions of the printed circuit board K. Specifically, the control computer controls the conveyance operations and the positioning operations of the printed circuit board K by the board conveyance device 2, and controls the suction operation, the conveyance operations, and the mounting operations of the component by the component transfer device 4. The control computer manages the number of the printed circuit boards K to produce and handles errors which arise during the production operations. The control computer acquires, in advance, various design information such as the correspondence relationship between the type of the printed circuit board K to be produced and the component type of the component P to be mounted, and the mounting coordinate positions of each of the components P on the printed circuit board K. The control computer acquires, in advance, various production information such as the arrangement order of the component type of the components P which are supplied from each of the tape feeders 32 of the component supply device 3, the mounting order of the components P to be mounted to the printed circuit board K, the number of the printed circuit boards K scheduled for production, and the scheduled production completion time.

Figure 2:
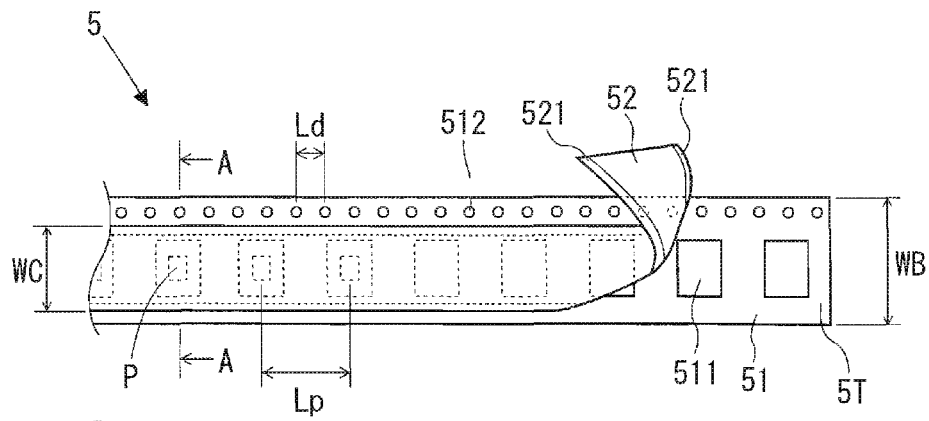
FIG. 2 is a plan view illustrating a portion close to a tip portion of a carrier tape.
Figure 3:
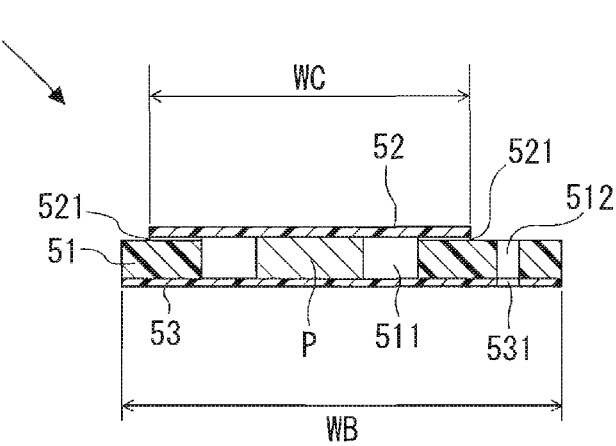
FIG. 3 is a diagram of the A-A arrow of FIG. 2 and is a sectional diagram illustrating a state in which the carrier tape stores a component.

Next, description will be given of the detailed structure of the carrier tape 5. FIG. 2 is a plan view illustrating a portion close to a tip portion 5T of the carrier tape 5. FIG. 3 is a diagram of the A-A arrow of FIG. 2 and is a sectional diagram illustrating a state in which the carrier tape 5 stores the component P. As illustrated in FIG. 3, the carrier tape 5 has a three layered structure of a base tape 51, a cover tape 52, and a bottom tape 53. The base tape 51 is formed of a flexible material such as a paper material or a resin, and is a band-shaped member which is long and narrow in a width dimension WB. In the vicinity of the center of the width direction of the base tape 51, multiple rectangular recessed accommodation portions 511 are provided at the equal pitch Lp in the length directions. Near the edge of one side of the base tape 51, many engagement holes 512 are provided in the longitudinal directions by being opened parallel to the edge at a fixed interval Ld.

The cover tape 52 is bonded to the surface of the base tape 51 to be possible to remove by peeling. The cover tape 52 is formed of a transparent polymeric film, and is a band-shaped member which is narrow, long, and thin in a width dimension WC. The width dimension WC of the cover tape 52 is narrower than the width dimension WB of the base tape, and is wider than the recessed accommodation portions 511. The thickness of the cover tape 52 is thinner than the base tape 51. Both edges of the cover tape 52 are adhered, by an adhesive 521 applied thereto, to the surface of the base tape 51 in a range avoiding the engagement holes 512 and the recessed accommodation portions 511.

Meanwhile, as illustrated in FIG. 3, the bottom tape 53 is bonded to the reverse surface of the base tape 51. The bottom tape 53 is formed of a transparent polymeric film, and is a band-shaped member which is narrow, long, and thin in the width dimension WB. The width dimension WB of the bottom tape 53 substantially matches the width dimension WB of the base tape 51. The thickness of the bottom tape 53 is thinner than the base tape 51 and is approximately the same as the cover tape 52. The bottom tape 53 is adhered, by an adhesive applied thereto, to the reverse surface of the base tape 51 in a range avoiding the recessed accommodation portions 511. Engagement holes 531 are also opened in the bottom tape 53 so as to overlay the engagement holes 512 of the base tape 51.

As illustrated in FIG. 2, the component P is stored in approximately the center of the recessed accommodation portion 511. Note that, from the start, the components P are not stored in the recessed accommodation portions 511 within a predetermined distance from the tip portion 5T and the rear end portion of the carrier tape 5, in the example of FIG. 2, up to the fifth recessed accommodation portion 511 from the tip portion 51T. As illustrated in FIG. 3, the recessed accommodation portion 511 is interposed between the cover tape 52 and the bottom tape 53 which are above and below the recessed accommodation portion 511, thereby sealing the component P. As illustrated in FIG. 2, in the vicinity of the supply position 32S of the tape feeder 32, the cover tape 52 is sequentially peeled off from the tip portion 5T of the base tape 51 and the components P are supplied.

Figure 4:
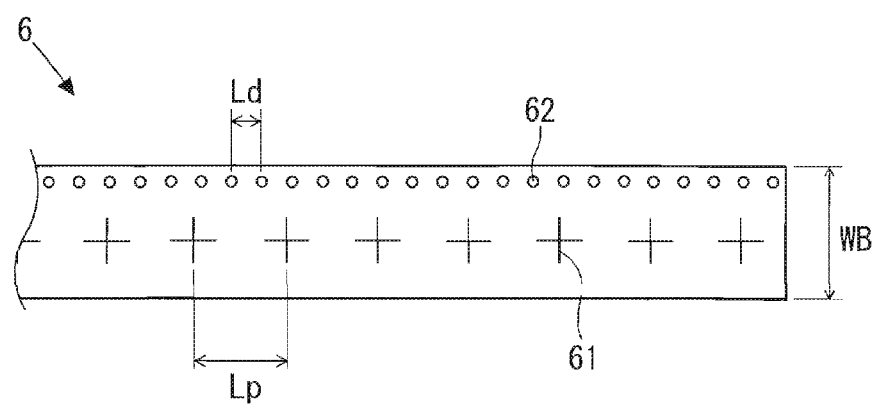
FIG. 4 is a plan view illustrating a measurement tape which is used instead of the carrier tape when measuring positional precision of a tape feeder.

Next, description will be given of a measurement tape 6 which is used by a feeder inspection jig 91 which is described later and which measures the positional precision of the tape feeder 32. FIG. 4 is a plan view illustrating the measurement tape 6 which is used instead of the carrier tape 5 when measuring positional precision of the tape feeder 32. The measurement tape 6 is formed of a thin metallic band which has a small coefficient of thermal expansion and does not distort or warp easily. The width dimension WB of the measurement tape 6 is equal to the width dimension WB of the base tape 51 of the carrier tape 5. Multiple cross-shaped measurement markers 61 are carved or depicted in the vicinity of the center of the measurement tape 6 in the width directions at an equal pitch which is the same as that of the recessed accommodation portions 511 of the carrier tape 5. Near the edge of one side of the measurement tape 6, many engagement holes 62 are provided by being opened parallel to the edge at the same interval Ld as the engagement holes 512 and 531 of the carrier tape 5.

Here, in the carrier tape 5, the pitch Lp at which the recessed accommodation portions 511 are formed includes a manufacturing error, and further, the base tape 51 may stretch and shrink due to temperature changes and external forces. In addition, the components P are not necessarily stored accurately in the centers of the recessed accommodation portions 511, and the pitch Lp between the components P is likely to have a large error. In contrast, the pitch Lp of the measurement markers 61 of the measurement tape 6 has significantly higher precision. Therefore, by using the measurement tape 6 instead of the carrier tape 5, it is possible to accurately measure the reproduction precision of the feed amount of the carrier tape 5, in other words, the positional precision in the supply position 32S of the tape feeder 32.

Figure 5:
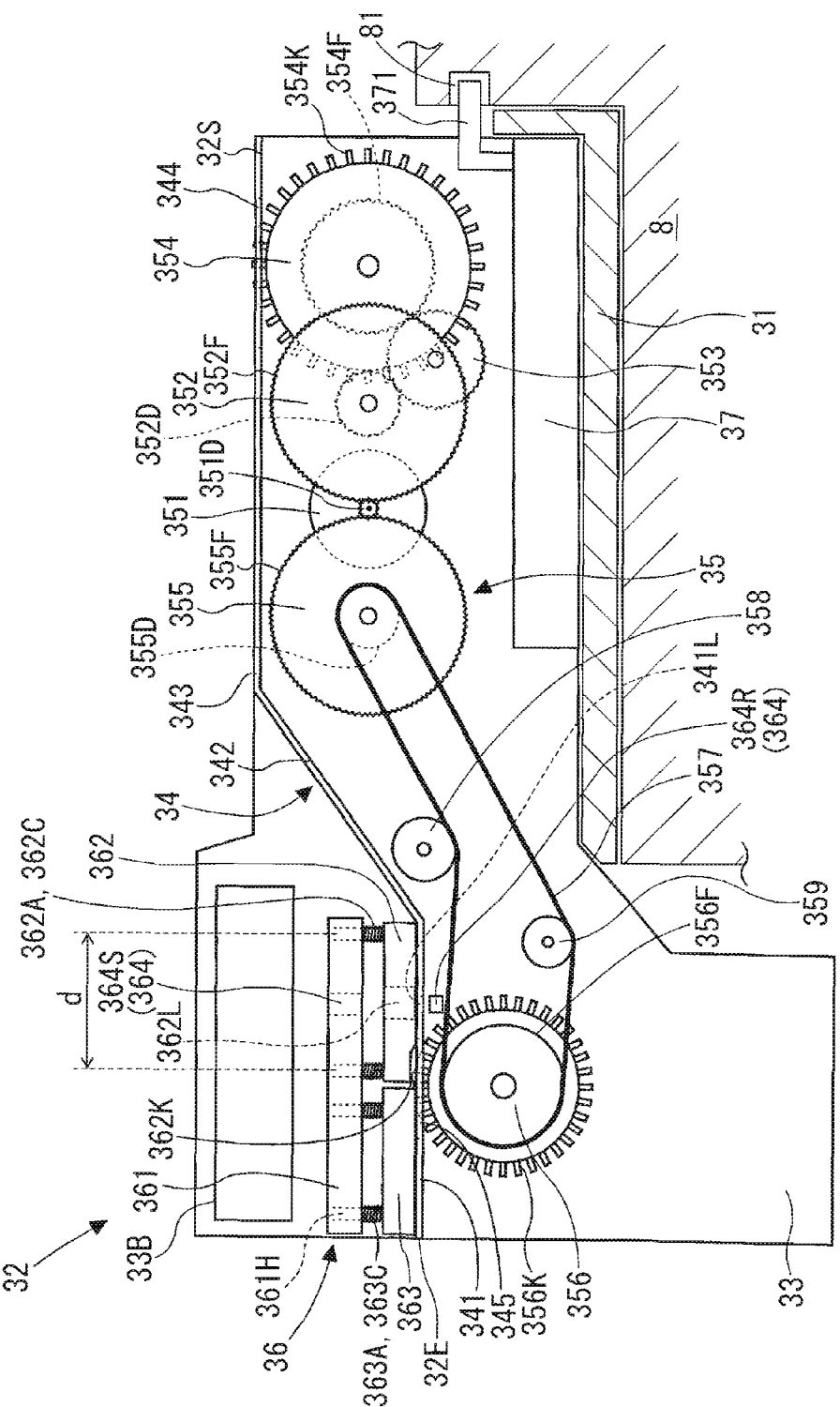
FIG. 5 is a side surface view of the tape feeder, the side plate of the front side of the paper surface is omitted, and a detailed structure of the inner portion is illustrated.

Next, description will be given of the detailed structure of the tape feeder 32. FIG. 5 is a side surface view of the tape feeder 32, the side plate of the front side of the paper surface is omitted, and a detailed structure of the inner portion is illustrated. The tape feeder 32 is formed by a rail 34, a tape feed mechanism 35, a next-tape control mechanism 36, a control section 37, a tape peeling mechanism which is omitted from the drawings, and the like being assembled between two side plates which form a feeder housing 33.

The two side plates which form the feeder housing 33 are arranged in parallel, separated by the amount of the width directions of the flat shape. The feeder housing 33 is longer than the support table 31 and the majority of the feeder housing 33 is positioned above the slots of the top surface of the support table 31; however, a portion of the rear side of the feeder housing 33 is positioned to run downward from the rear side (the left side in the drawing) of the support table 31. In the feeder housing 33, a rectangle is cut out of the top portion near the rear side, and a holding handle 33B for carrying is formed. A feeder specification code which specifies the tape feeder 32 is attached to the side surface of the feeder housing 33. A bar-code can be given as an example of the feeder specification code, and the configuration is not limited thereto.

The rail 34 is a member which guides the feeding of the carrier tape 5 using the top surface of the rail 34. The rail 34 is a narrow and long plate-shaped member which extends from the rear end to the front end on the inside of the feeder housing 33, and is bent at two locations in the middle. In order from the rear end to the front side, the rail 34 is formed of a horizontal first rail section 341, an upward-inclined second rail section 342, and a horizontal third rail section 343. Using the length of the first rail section 341 as a reference, the second rail section 342 is slightly shorter, and the third rail section 343 is much longer. The insertion port 32E is formed in the rear end of the first rail section 341. The insertion port 32E is configured such that it is possible to insert two carrier tapes 5, one overlaying the other, and it is therefore possible to load the carrier tapes 5. The top surface of the vicinity of the tip of the third rail section 343 corresponds to the supply position 32S.

The tape peeling mechanism which is omitted from the drawings is arranged near the supply position 32S. The tape peeling mechanism peels the cover tape 52 from the base tape 51 by one pitch Lp at a time in synchronization with the intermittent feeding of the carrier tape 5. For the tape peeling mechanism, since it is possible to apply the well known technique disclosed in Japanese Patent No. 2662948, JP-A-2009-140994, JP-UM-B-H7-23994, and the like, description thereof will be omitted.

The tape feed mechanism 35 is arranged below the rail 34 and intermittently feeds the carrier tape 5 one pitch Lp at a time along the top surface of the rail 34, to the supply position 32S. The tape feed mechanism 35 is formed of a motor 351, a first gear 352, a second gear 353, a first sprocket 354, a third gear 355, a second sprocket 356, and the like.

The motor 351, the first gear 352, the second gear 353, and the first sprocket 354 are arranged below the third rail section 343 in order from the rear side to the front side. A small diameter drive gear 351D is fixed to the output shaft of the motor 351. The first gear 352 is supported by a bearing to rotate freely, has a follower gear 352F on the outer circumference, and has an inner drive gear 352D on the inside. The follower gear 352F meshes with the drive gear 351D of the output shaft of the motor 351. The second gear 353 is supported by a bearing to rotate freely and meshes with the inner drive gear 352D of the first gear 352. The first sprocket 354 is supported by a bearing to rotate freely, has engaging protrusions 354K formed at a fixed angular interval on the outer circumference, and has an inner follower gear 354F on the inside. The inner follower gear 354F meshes with the second gear 353. The engaging protrusions 354K protrude upward from entrance holes 344 which are opened in the third rail section 343 and are configured to engage with the engagement holes 512 and 531 of the carrier tape 5 and the engagement holes 62 of the measurement tape 6. Note that, it is preferable that the protrusion amount of the engaging protrusions 354K from the entrance holes 344 is the same as the thickness of the carrier tape 5 or greater than or equal to the thickness.

The third gear 355 is arranged closer to the rear side than the motor 351 which is below the third rail section 343. The third gear 355 is supported by a bearing to rotate freely, has a follower gear 355F on the outer circumference, and has an inner drive pulley 355D on the inside. The follower gear 355F meshes with the drive gear 351D of the output shaft of the motor 351. Meanwhile, the second sprocket 356 is arranged below the first rail section 341. The second sprocket 356 is supported by a bearing to rotate freely, has engaging protrusions 356K formed at a fixed angular interval on the outer circumference, and has an inner follower pulley 356F slightly to the inside. The engaging protrusions 356K protrude upward from entrance holes 345 which are opened in the first rail section 341 and are configured to engage with the engagement holes 512 and 531 of the carrier tape 5 and the engagement holes 62 of the measurement tape 6. Note that, the protrusion amount of the engaging protrusions 356K from the entrance holes 345 is limited to less than or equal to the thickness of the carrier tape 5.

A drive belt 357 is wound between the inner drive pulley 355D of the third gear 355 and the inner follower pulley 355F of the second sprocket 356 so as to revolve. Tension pulleys 358 and 359 are provided to rotate freely in the middle of each of the outgoing path and the return path in which the drive belt 357 revolves. The two tension pulleys 358 and 359 generate tension by pressing the drive belt 357 and prevent slipping of the drive belt 357.

In the tape feed mechanism 35 described above, when the output shaft of the motor 351 rotates counterclockwise by an amount corresponding to the pitch Lp, the first sprocket 354 is driven to rotate clockwise via the first gear 352 and the second gear 353, and the second sprocket 356 is driven to rotate clockwise via the third gear 355 and the drive belt 357. Although the first sprocket 354 and the second sprocket 356 are both driven to rotate at a reduced speed, the reduction ratios are the same, and it is possible to intermittently feed the carrier tape 5 and the measurement tape 6 in synchronization by one pitch Lp at a time.

The next-tape control mechanism 36 is arranged above the first rail section 341. The next-tape control mechanism 36 allows the feeding of the first carrier tape 5 which is currently being used, and controls the holding and the feeding of the tip portion 5T of the second carrier tape 5 to be used next. The next-tape control mechanism 36 is formed of a mechanism base section 361, a first pressing member 362, a second pressing member 363, a tape end detection sensor 364, and the like.

The mechanism base section 361 is a block-shaped member which is long in the forward-backward directions, and is fixed above the first rail section 341 to be separated from and parallel to the first rail section 341. Two sets of a pair of slide holes 361H, which are separated in the forward-backward directions by a predetermined distance d and penetrate the mechanism base section 361 in the up-down directions, are opened in the mechanism base section 361. In other words, a total of four slide holes 361H are provided to line up in the forward-backward directions.

The first pressing member 362 and the second pressing member 363 are block-shaped members, the length of each being slightly less than half that of the mechanism base section 361. The first pressing member 362 and the second pressing member 363 are arranged between the mechanism base section 361 and the first rail section 341 with the first pressing member 362 in front. The first pressing member 362 includes two slide shafts 362A which are provided to stand on the top surface of the first pressing member 362 separated by the predetermined distance d in the forward-backward directions. The two slide shafts 362A are engaged to be capable of up-down movement in the two slide holes 361H of the front side of the mechanism base section 361. A coil spring 362C is arranged around the circumference of each of the two slide shafts 362A. One end of the top side of the coil spring 362C abuts the mechanism base section 361, and the other end of the bottom side of the coil spring 362C presses the first pressing member 362 toward the first rail section 341.

Similarly, the second pressing member 363 includes two slide shafts 363A which are provided to stand on the top surface of the second pressing member 363 separated by the predetermined distance d in the forward-backward directions. The two slide shafts 363A are engaged to be capable of up-down movement in the two slide holes 361H of the rear side of the mechanism base section 361. A coil spring 363C is arranged around the circumference of each of the two slide shafts 363A. One end of the top side of the coil spring 363C abuts the mechanism base section 361, and the other end of the bottom side of the coil spring 363C presses the second pressing member 363 toward the first rail section 341.

According to the configuration described above, the first pressing member 362 and the second pressing member 363 are capable of independently moving in the up-down directions, and, cannot move in the forward-backward directions and the width directions. The engaging protrusions 356K of the second sprocket 356 are arranged to protrude highest at an intermediate position between the first pressing member 362 and the second pressing member 363. Here, the bottom face of the second pressing member 363 is a horizontal plane, and a cutout holding section 362K is formed in the bottom face of the first pressing member 362. The cutout holding section 362K is formed by cutting the rear side of the bottom face of the first pressing member 362, and the cutout height thereof is set to be greater than the thickness of the carrier tape 5.

In the set-up work, when the first carrier tape 5 is inserted and loaded from the insertion port 32E of the rear end of the first rail section 34, the tip portion 5T of the carrier tape 5 proceeds to the front side between the second pressing member 363 and the first rail section 341 against the coil spring 363C. When the engaging protrusions 356K of the second sprocket 356 engage with the engagement holes 512 and 531 of the carrier tape 5, from this point onward, the carrier tape 5 is fed by the second sprocket 356. Accordingly, the tip portion 5T of the carrier tape 5 proceeds to the front side between the first pressing member 362 and the first rail section 34 against the coil spring 362C. The tip portion 5T of the carrier tape 5 proceeds from the second rail section 342 to the third rail section 343. When the engaging protrusions 354K of the first sprocket 354 engage with the engagement holes 512 and 531 of the carrier tape 5, from this point onward, the carrier tape 5 is fed by the first sprocket 354. The tip portion 5T of the carrier tape 5 proceeds to the supply position 32S and the tape peeling mechanism is set.

When the second carrier tape 5 is overlaid onto the first carrier tape 5 and is inserted and loaded from the insertion port 32E, the tip portion 5T of the second carrier tape 5 proceeds to the front side between the second pressing member 363 and the first carrier tape 5 against the coil spring 363C. At this time, the engaging protrusions 356K of the second sprocket 356 do not engage with the engagement holes 512 and 531 of the second carrier tape 5. This is because the protrusion amount of the engaging protrusions 356K is limited to less than or equal to the thickness of the carrier tape 5, and the engaging protrusions 356K are already engaged with the engagement holes 512 and 531 of the first carrier tape 5 and are hidden. Therefore, the second carrier tape 5 proceeds to the cutout holding section 362K of the first pressing member 362, stops, and is held.

The production of the printed circuit board proceeds, and when the rear end portion of the first carrier tape 5 passes beneath the second pressing member 363, the second carrier tape 5 is pressed downward into the second pressing member 363 and abuts the first rail section 341. Accordingly, the engaging protrusions 356K of the second sprocket 356 engage with the engagement holes 512 and 531 of the second carrier tape 5, and the second carrier tape 5 is fed. At the same time, it is possible to overlay the third carrier tape 5 onto the second carrier tape 5 and insert and load these from the insertion port 32E.

The tape end detection sensor 364 interposes the first pressing member 362 and the first rail section 341 from above and below. Specifically, the tape end detection sensor 364 is formed of a light emitting section 364S and a light receiving section 364R. The light emitting section 364S is provided in the mechanism base section 361 and emits measurement light downward. The light receiving section 364S is provided on the bottom side of the first rail section 341 and receives the measurement light from above. A light transmitting hole 362L is opened in the first pressing member 362 and a light transmitting hole 341L is opened in the first rail section 341 so as to not block the passage of the measurement light.

The tape end detection sensor 364 is controlled by being connected to the control section 37, and the detection results are ascertained by the control section 37. The tape end detection sensor 364 detects the light which is transmitted by the recessed accommodation portions 511 of the carrier tape 5 which is fed over the first rail section 341, and detects the blocking of the light by the components P. Therefore, when the tape end detection sensor 364 detects the recessed accommodation portion 511 and does not detect the component P, the control section 37 can detect the recessed accommodation portion 511 in which the component P of the tip portion 5T and the rear end portion of the carrier tape 5 is not stored.

As can be understood from the description so far, the tape feeder 32 which is used in the embodiment corresponds to a next-tape-loading tape feeder of the present disclosure. The cutout holding section 362K of the bottom face of the first pressing member 362 corresponds to a preparation position at which the tip portion 5T of the next carrier tape 5 is loaded.

The control section 37 is arranged near the bottom of the front side of the feeder housing 33. The control section 37 is provided with a microprocessor, memory, a driver, and the like which are omitted from the drawings, is further provided with a communication connector 371 on the top portion of the front side, and operates by software. When the tape feeder 32 is inserted and loaded into the slot of the support table 31, the communication connector 371 is automatically inserted into a communication socket 81 of the device table 8 side and is connected. Accordingly, the control section 37 is connected to the control computer of the component mounting machine 1 to perform communication, and is capable of transferring the necessary information.

The control section 37 controls a drive current of the motor 351 of the tape feed mechanism 35 via a driver. The control section 37 detects the tip portion 5T and the rear end portion of the carrier tape 5 based on the detection results of the tape end detection sensor 364 of the next-tape control mechanism 36. Note that, the control section 37 stores information corresponding to the feeder specification code in a memory, and is used in the communication with the control computer. The control section 37 holds the component type specification codes of the first reel 391 and the second reel 392 which are held in the reel holding section 39. It is possible to receive the component type specification codes of the first reel 391 and the second reel 392 by reading using a separate bar-code reader and the communication from the control computer.

In the tape feeder 32 of the component mounting machine 1 which is described above, the feed amount when the tape feed mechanism 35 intermittently feeds the carrier tape 5 by the predetermined pitch Lp at a time does not necessarily strictly match every time, and may fluctuate. The fluctuation of the feed amount is directly linked to the positional precision of the supply position 32S at which the components P are actually transferred. Individual differences in the positional precision of the supply position 32S of the tape feeders 32 caused by the tolerances of the various constituent members and the like cannot be avoided, even if the same type of tape feeder 32 is used. In addition, it is conceivable that the positional precision decreases with the passage of time due to, for example, the wearing of the engaging protrusions 354K of the first sprocket 354, an increase in the looseness of the bearing section which bears the first sprocket 354, and the like caused by operation over many years. The feeder component type determination method of the embodiment is performed as a countermeasure to such individual differences and degradation with the passage of time of the positional precision of the supply position 32S of the tape feeders 32.

Figure 6:
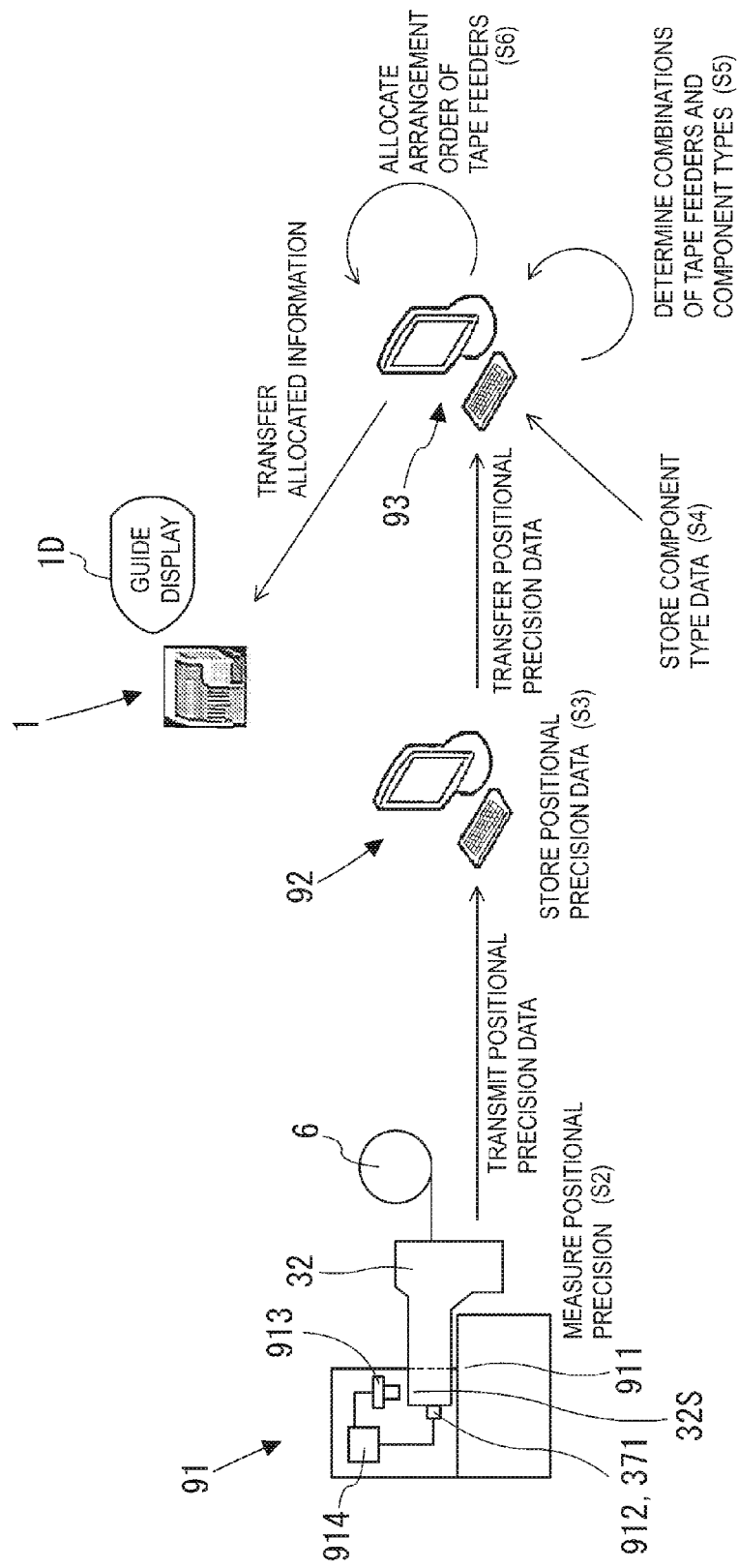
FIG. 6 is a diagram schematically explaining the feeder component type determination method of the embodiment.

FIG. 6 is a diagram schematically explaining the feeder component type determination method of the embodiment. Note that, S2 to S6 which are denoted within brackets in the drawing correspond to the respective steps S2 to S6 of the flowchart of FIG. 7. As illustrated, the feeder component type determination method of the embodiment is carried out by, not only the component mounting machine 1 and an operator, but also the cooperative work of the feeder inspection jig 91, a host computer 92, and a job management computer 93. Next, description will be given of the configuration and functions of these devices 91, 92, and 93. Note that, the component mounting machine 1, the feeder inspection jig 91, the host computer 92, and the job management computer 93 are connected to perform communication with each other, and are capable of transferring data.

The feeder inspection jig 91 corresponds to a positional precision measuring means of the present disclosure, and is formed of a support table 911, a communication socket 912, an imaging camera 913, a jig control section 914, and the like. A slot is formed in the top surface of the support table 911. When the operator inserts the tape feeder 32 which performs the measurement of the positional precision into the slot of the support table 911, the communication connector 371 of the tape feeder 32 is automatically inserted into the communication socket 912 of the feeder inspection jig 91 and is connected. The communication socket 912 is connected to the jig control section 914. Accordingly, the jig control section 914 is connected to the control section 37 of the tape feeder 32 to perform communication, and is capable of transferring the necessary information.

The imaging camera 913 is arranged directly above the supply position 32S of the tape feeder 32 which is inserted into the slot of the support table 911. Accordingly, the supply position 32S is arranged in the center of the imaging visual field of the imaging camera 913. The imaging camera 913 performs an imaging operation by a command from the jig control section 914 and outputs the acquired image data to the jig control section 914. The imaging camera 913 has a sufficient resolution to be capable of imaging the measurement markers 61 of the measurement tape 6 with sufficient precision, and the imaging conditions are also set for the same purpose.

Here, description will be given of a method of performing the measurement of the positional precision of the tape feeder 32 using the feeder inspection jig 91. During the measurement, the measurement tape 6 is loaded into the tape feeder 32 in place of the carrier tape 5. First, the jig control section 914 acquires the feeder specification code from the control section 37 of the tape feeder 32 which is inserted into the slot of the support table 911. Next, the jig control section 914 feeds the measurement tape 6 to the supply position 32S of the tape feeder 32. Thirdly, the jig control section 914 causes the intermittent feeding of the measurement tape 6 by the tape feeder 32 one pitch Lp at a time and the imaging of the measurement markers 61 by the imaging camera 913 to be performed alternately.

The jig control section 914 obtains the reproduction precision of the feed amount of the measurement tape 6 from the imaging data of the plurality of measurement markers 61 which are obtained consecutively, that is, obtains the positional precision at the supply position 32S. The positional precision is at its highest in an ideal state in which the measurement markers 61 do not move at all in the plural items of image data of the imaging camera 913. The positional precision which is the measurement result can be represented using the maximum value of the error by which the measurement markers 61 moved in the plural items of image data, for example, and another method such as also using the average value of the error may also be adopted. Note that, it is preferable that the repetition of the imaging of the measurement markers 61 is continued until the first sprocket 354 of the tape feeder 32 completes at least one rotation. Accordingly, it is possible to accurately detect the error caused by nonuniformity of the total circumference of the first sprocket 354. The jig control section 914 transmits positional precision data, in which the feeder specification code is associated with the positional precision obtained by the measurement, to the host computer 92.

The operator performs the measurement of the positional precision at the supply position 32S in order in relation to the plurality of tape feeders 32 which are the measurement targets using the feeder inspection jig 91. Even for the same tape feeders 32, it is preferable to perform the measurement of the positional precision again after a long operation time has elapsed, after a large stress has been applied, or the like. Here, the positional precision at the supply position 32S of each of the tape feeders 32 can be considered to be the stopping positional precision of the recessed accommodation portion 511 of the carrier tape 5 in relation to the supply position 32S during the execution of a feed operation of the carrier tape 5 by the tape feeder 32. For example, in the case of minute components, when the shifting amount between the stopping position of the recessed accommodation portion 511 of the carrier tape 5 and the supply position 32S is great in comparison to the component dimension, it is not possible to suck the minute components.

The host computer 92 stores and manages the positional precision data of the plurality of tape feeders 32. According to a request from the job management computer 93, the host computer 92 transfers the positional precision data of the tape feeder 32 which is requested.

The job management computer 93 manages a plurality of jobs in which the component mounting machine 1 produces the printed circuit board K. The job management computer 93 holds job information for each type of the printed circuit board K which is produced by the component mounting machine 1. The job information includes the various design information and the various production information described by the control computer of the component mounting machine 1. The job management computer 93 performs a production command by transmitting the job information relating to the printed circuit board K to be produced next to the component mounting machine 1.

Figure 7:
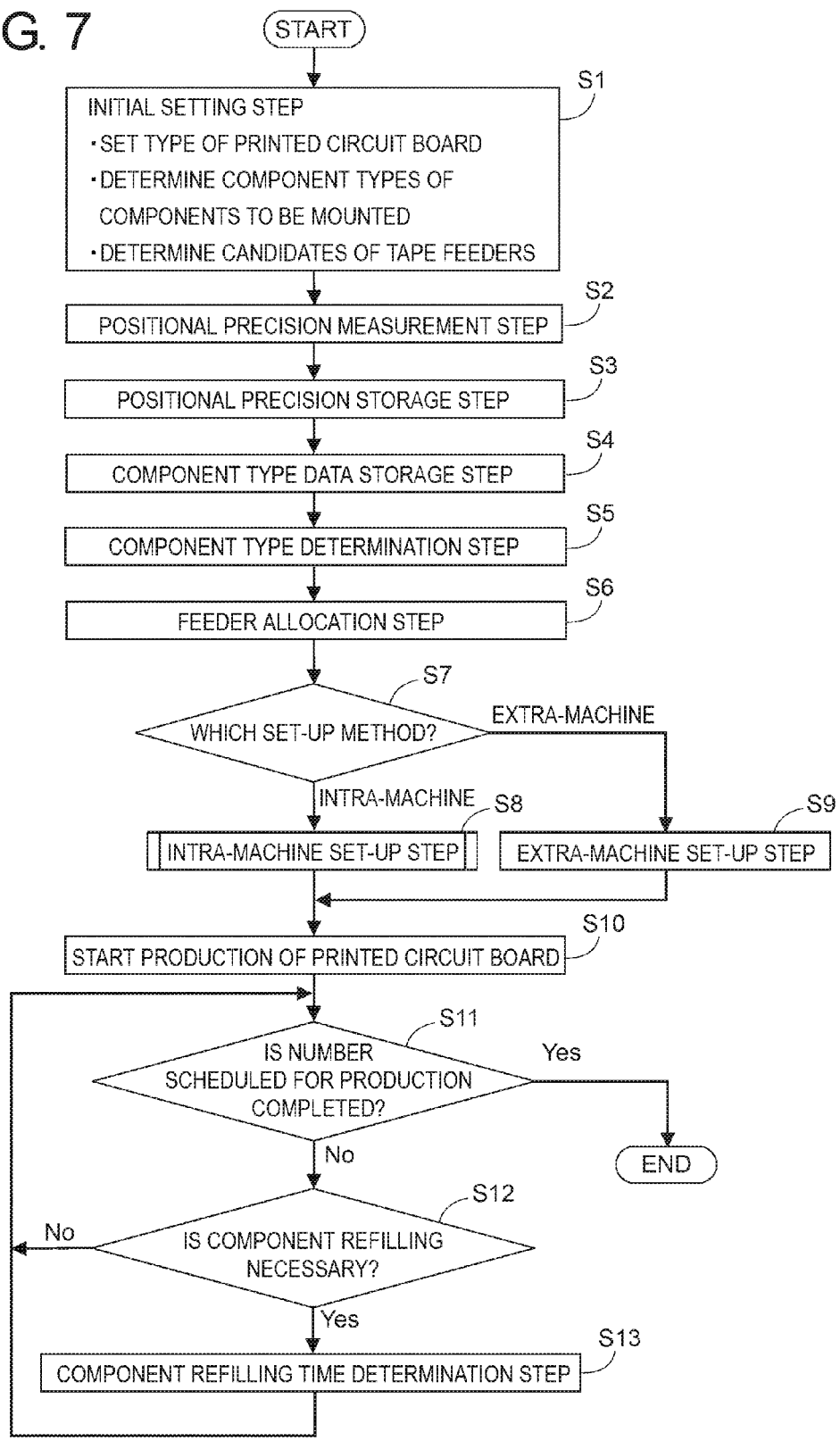
FIG. 7 is a flowchart explaining the execution order of the feeder component type determination method of the embodiment.

Next, description will be given of the method of executing the feeder component type determination method of the embodiment, and of an example of the usage thereof. FIG. 7 is a flowchart explaining the execution order of the feeder component type determination method of the embodiment. FIG. 8 is a diagram of a combination table of tape feeders F1 to F8 and component types P1 to P8 explaining the operations of the feeder component type determination method of the embodiment by exemplification. In the initial setting step S1 of FIG. 7, first, the job management computer 93 sets the type of the printed circuit board K to be produced next. Then, the eight types of component to be mounted by the component mounting machine 1 are determined to be the component types P1 to P8, and the type, specifications, and the like of the eight tape feeders 32 which are used to supply the eight component types P1 to P8 are determined.

Here, the user generally had more than eight tape feeders and performs selection as appropriate. Each tape feeder is periodically subjected to maintenance, the positional precision thereof is measured, and is often stored in a storage room. The job management computer 93 creates a list of at least eight tape feeders of applicable types, specifications, and the like as usage candidates from the many unused tape feeders in the storage room. When there are exactly eight usage candidates, the job management computer 93 determines the combinations with the eight component types P1 to P8 in the following steps. When there are more than eight usage candidates, the job management computer 93 narrows the usage candidates to eight and determines the combinations with the eight component types P1 to P8 in the following steps.

Here, as illustrated in FIG. 8 as a specific example, a case is considered in which the component types P1 to P4, which are four types of medium component, and the component types P5 to P8, which are four types of minute component, are mounted. A tape width dimension W1 of the carrier tape 5 which stores the medium components is greater than a tape width dimension W2 of the carrier tape 5 which stored the minute components. Therefore, four of each of the medium tape feeders F1 to F4 corresponding to the tape width dimension W1 and the minute tape feeders F5 to F8 corresponding to the tape width dimension W2 are necessary. Note that, the symbols P1 to P8 given to the component types correspond to component type specification codes, and the symbols F1 to F8 given to the tape feeders correspond to the feeder specification codes.

For the component types P1 to P4 of the medium components, the allowable positional precision in the supply position 32S of the tape feeder 32 is comparatively lenient, and there is no concern of suction faults, no matter which of the medium tape feeders F1 to F4 the component types P1 to P4 are combined with. Therefore, for the medium tape feeders F1 to F4, the measurement of the positional precision is omitted.

Meanwhile, for the minute components P5 to P8, since the allowable positional precision is strict, there is a concern that suction faults will occur frequently if the minute tape feeders F5 to F8 are combined with the component types P5 to P8 at random. Additionally, the allowable positional precision generally becomes stricter the smaller the component external dimensions of the component. Therefore, in the positional precision measurement step S2, the operator measures the positional precision of each of the four minute tape feeders F5 to F8 using the feeder inspection jig 91. Note that, during the storage in the storage room, when the measurement corresponding to the positional precision measurement step S2 is performed and the measurement results remain, repeated measurement may be omitted. As an example of the measurement results, the positional precision of the fifth tape feeder F5 is the lowest, in other words, an error Er5 is the greatest, and thereafter, the positional precision increases in the order of the sixth to the eighth tape feeder F6 to F8. In other words, the relationship of error Er5>error Er6>error Er7>error Er8 is established.

In the next positional precision data storage step S3, the host computer 92 stores positional precision data in which the feeder specification codes which specify the fifth to the eighth tape feeders F5 to F8 which are subjected to the measurement are associated with the positional precisions (the errors Er5 to Er8).

In the next component type data storage step S4, the job management computer 93 stores the component type data relating to the component types P1 to P8 of the components to be mounted to the printed circuit board K to be produced next. The component type data is data in which the component type specification codes which specify the component types P1 to P8 are associated with at least one of the component external dimensions and the allowable positional precision of the corresponding component types. The job management computer 93 may acquire the component type data from another device through communication, may acquire the component type data from a portable memory medium, and may acquire the component type data from an input operation of the operator. In the specific example, allowable position errors Av5 to Av8 corresponding to the allowable positional precisions of the component types P5 to P8 of the minute components will be considered. For example, it will be assumed that the relationship of allowable position error Av5>allowable position error Av6>allowable position error Av7>allowable position error Av8 is established.

In the next component type determination step S5, the job management computer 93 first receives the positional precision data of the fifth to the eighth tape feeders F5 to F8 from the host computer 92. The job management computer 93 next determined the combinations of the tape feeders and the component types of the components which are stored in the carrier tapes based on the positional precisions (the errors Er5 to Er8) of the fifth to the eighth tape feeders F5 to F8 and at least one of the component external dimensions determined by the component type of the components and the allowable positional precision when the component is supplied to the supply position by the tape feeder. In the specific example, the job management computer 93 determines the combinations of the fifth to the eighth tape feeders F5 to F8 with the component types P5 to P8 based on the error Er5 to the error Er8 of the fifth to the eighth tape feeders F5 to F8 and the allowable position errors Av5 to Av8 which are determined according to the component types P5 to P8.

In FIG. 8, a total of 64 items at which the tape feeders F1 to F8 intersect the component types P1 to P8 indicate the viability of the corresponding combination. In other words, the B symbol and the A symbol indicate a valid combination, the D symbol indicates an invalid combination, and a vacant item indicates a physically invalid combination due to a mismatch in the tape width dimensions W1 and W2. Here, the error Er5 of the fifth tape feeder F5 is smaller than the allowable position error Av6 and greater than the allowable position error Av7, and the error Er6 of the sixth tape feeder F6 is smaller than the allowable position error Av8.

At this time, the job management computer 93 avoids the combinations of the fifth tape feeder F5 with the component types P7 and P8 (the D symbols in FIG. 8). In other words, when the allowable positional precision of the component types P7 and P8 is stricter than the positional precision of the fifth tape feeder F5, the job management computer 93 avoids the combinations of the tape feeder F5 with the component types P7 and P8. Accordingly, it is possible to prevent the frequent occurrence of suction faults due to poor positional precision. Therefore, the component type determination step S5 includes a poor precision avoidance step of the present disclosure.

The higher the positional precision of the fifth to the eighth tape feeders F5 to F8, the stricter the allowable positional precision of the component type, the job management computer 93 combines therewith, and the lower the positional precision of the fifth to the eight tape feeders F5 to F8, the more lenient the allowable positional precision of the component type the job management computer 93 combines therewith. Accordingly, the combinations indicated with the A symbol in FIG. 8 are adopted. In other words, the eighth tape feeder F8 which has the smallest error Er8 is combined with the component type P8 which has the strictest allowable position error Av8. Thereafter, the component types P7, P6, and P5 which are lined up in order from the strictest allowable position error Av7, Av6, and Av5 to correspond to the seventh, sixth, and fifth tape feeders F7, F6, and F5 which are lined up in order from the smallest error Er7, Er6, and Er5 are respectively combined.

Note that, the poor precision avoidance step is not essential. A method may be adopted in which the degree of positional precision of the fifth to the eighth tape feeders F5 to F8 is not associated with the strictness of the allowable positional precision of the component types P5 to P8. In other words, in FIG. 8, the combinations of the fifth to the eighth tape feeders F5 to F8 and the component types P5 to P8 are not limited to only the A symbols, and A symbols and B symbols may be combined and adopted as appropriate. When there are five or more candidates for the minute tape feeder, the four to be used are selected based on the measured positional precisions, and the combinations with the component types P5 to P8 are determined. The combinations of the four medium tape feeders F1 to F4 and the medium component types P1 to P4 are free and any combination of the B symbols may be adopted.

In the next feeder allocation step S6, the job management computer 93 allocates the arrangement order of the eight tape feeders F1 to F8 to the slots of the holding table 31. Here, the mounting operation efficiency of the component transfer device 4 changes depending on the arrangement order of the component types P1 to P8 on the holding table 31. Therefore, the optimized arrangement order of the components P1 to P8 is often obtained in advance according to a simulation of the job management computer 93 or another device. Therefore, the job management computer 93 allocates the arrangement order of the eight tape feeders F1 to F8 so as to realize the optimized arrangement order of the component types P1 to P8.

Next, the job management computer 93 transfers the allocated information to the component mounting machine 1. The component mounting machine 1 guides the operator by displaying the allocated information on a display device 1D. As the guide display, for example, the combination table illustrated in FIG. 8 may be displayed as it is, but the configuration is not limited thereto. The operator determines the set-up method in step S7, and the process proceeds to the intra-machine set-up step S8 or the extra-machine set-up step S9.

In the intra-machine set-up step S8, the operator loads the carrier tapes 5 which store the components of the component types P1 to P8 according to the positions of the plurality of tape feeders F1 to F8 which are equipped in the component supply device 3 into the tape feeders 32, and sets up a state in which each of the tape feeders 32 is capable of supplying the components of each of the component types P1 to P8 to the respective supply position 32S. In other words, the operator first follows the guide display of the display device 1D and causes the tape holding section 39 of each of the tape feeders F1 to F8 of the support table 31 which is equipped to the device table 8 to hold the carrier tape 5 of the correct component type P1 to P8. Next, the operator correctly sorts the tape feeders 32 on the support table 31 by rearranging the arrangement order of the tape feeders 32.

At each point in time of the intra-machine set-up work of the operator, the control computer of the component mounting machine 1 is connected to communicate with the control section 37 of the tape feeders F1 to F8. Therefore, the control computer or the job management computer 93 can determine whether or not the combinations of the tape feeders F1 to F8 and the component types P1 to P8 match the guide display of the display device 1D and are correct. The control computer or the job management computer 93 can determine whether or not the arrangement order of the tape feeders F1 to F8 on the support table 31, that is, the arrangement order of the component types P1 to P8 matches the guide display of the display device 1D and is correct. The control computer or the job management computer 93 successively performs the guide display of the determination results on the display device 1D and supports the inter-machine set-up work.

In the extra-machine set-up step S9, the operator performs the set-up by loading the carrier tapes 5 into the plurality of tape feeders F1 to F8 at a location separated from the component mounting machine 1, setting each of the tape feeders 32 to a state in which it is possible to supply the components to the respective supply position 32S, and sorting the arrangement order of the tape feeders 32. In other words, the operator first follows the guide display of the display device 1D and causes the tape holding section 39 of each of the tape feeders F1 to F8 to hold the carrier tape 5 of the correct component type P1 to P8 at a location separated from the component mounting machine 1. Next, the operator correctly sorts the tape feeders 32 in the support table 31 which is removed from the device table 8 of the component mounting machine 1 or in the spare support table 31. Finally, the operator equips the tape feeders F1 to F8 in the device table 8 at once together with the support table 31.

At this time, the control computer of the component mounting machine 1 is connected to communicate with the control section 37 of the tape feeders F1 to F8. Therefore, the control computer or the job management computer 93 can determine whether or not the combinations of the tape feeders F1 to F8 and the component types P1 to P8 match the guide display of the display device 1D and are correct. The control computer or the job management computer 93 can determine whether or not the arrangement order of the tape feeders F1 to F8 on the support table 31, that is, the arrangement order of the component types P1 to P8 matches the guide display of the display device 1D and is correct. When, hypothetically, the combinations of the tape feeders F1 to F8 and the component types P1 to P8 or the arrangement order of the tape feeders F1 to F8 are not correct, the control computer or the job management computer 93 instructs the operator to carry out correction work using the guide display of the display device 1D.

When the intra-machine set-up step S8 or the extra-machine set-up step S9 is completed, in step S10, the component mounting machine 1 starts the production of the printed circuit board K by performing component mounting. From the start of production onward, the control computer of the component mounting machine 1 determines whether or not the number of the printed circuit boards K which are produced has reached the number scheduled for production in step S11, and determines whether or not any of the tape feeders 32 needs the components refilled in step S12.

In step S12, when it is necessary to refill the components, the process proceeds to the component refilling time determination step S13. In this case, the operator loads the next carrier tape 5 which stores components of the same component type into the tape feeder 32 into which the component-depleted carrier tape 5 is loaded. The control computer or the job management computer 93 determines the validity of the combination of the positional precision of the tape feeder 32 and at least one of the component external dimensions and the allowable positional precision which are determined according to the component type of the components which are stored in the next carrier tape 5.

When loading the next carrier tape 5 of the same component type during the component refilling, ordinarily, the allowable positional precision is the same and no problems arise. However, when the component maker is different, the component is changed in minor ways, or the like, even if the component type is the same, the allowable positional precision may differ. In consideration of this fact, the component refilling time determination step S13 is performed. The component type data of the components which are stored in the next carrier tape 5 can be acquired, for example, by reading the component type specification code of the reel which is wound on the next carrier tape 5 using a separate bar-code reader. Therefore, the control computer or the job management computer 93 can determine the validity of the combination from the positional precision data of the fifth to the eighth tape feeders F5 to F8, and the component type data of the components which are stored in the next carrier tape 5.

In step S11, when the number of produced printed circuit boards K reaches the scheduled production number, all steps of the feeder component type determination method of the embodiment are completed. Next, another type of the printed circuit board K is set, and the feeder component type determination method of the embodiment is repeated.

Figure 9:
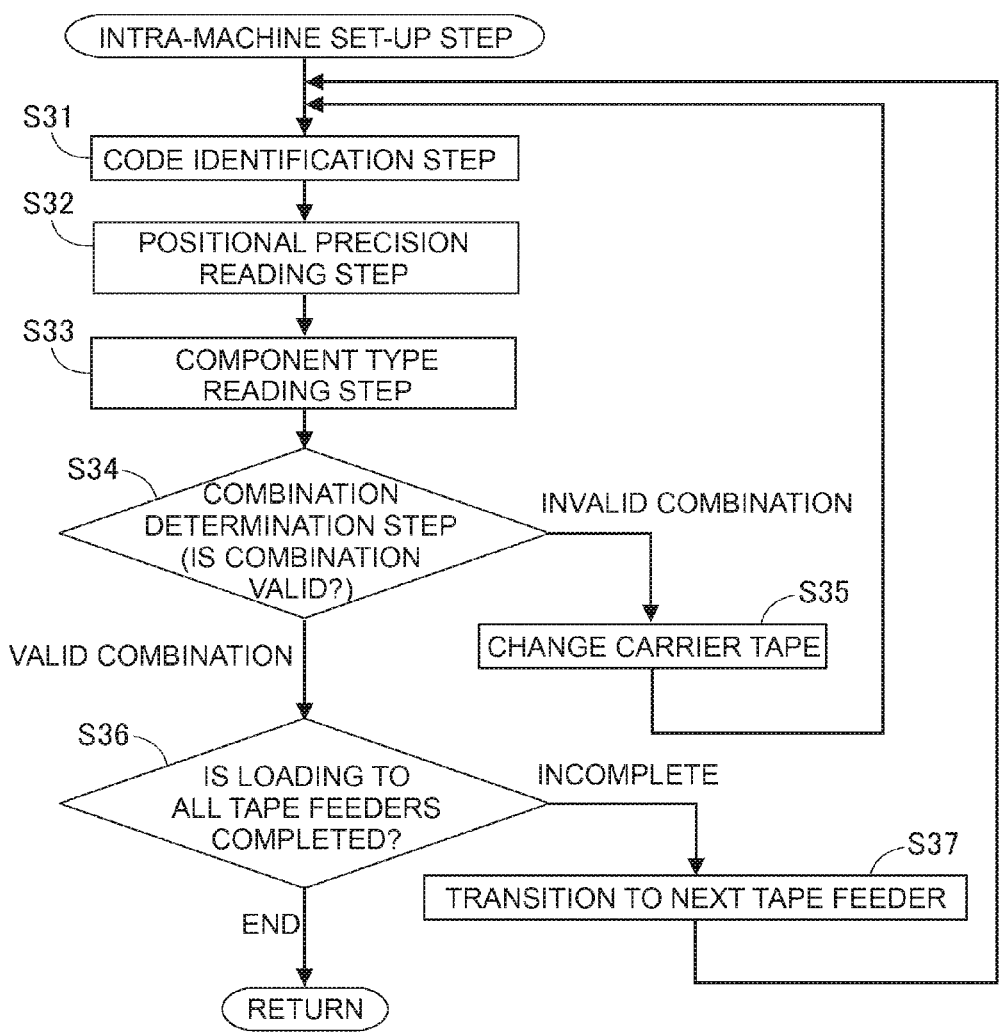
FIG. 9 is a flowchart explaining an application of an intra-machine set-up step.

Next, description will be given of an application of the intra-machine set-up step S8. In the application, incorrect loading work by the operator when loading the carrier tape 5 in the tape feeder 32 is automatically avoided. FIG. 9 is a flowchart explaining the application of the intra-machine set-up step S8. In the application, an insertion port restriction mechanism (omitted from the drawings) is provided in the insertion port 32E of the tape feeder 32. The insertion port restriction mechanism operated by the commands from the control section 37, and is capable of totally closing the insertion port 32E, half opening the insertion port 32E such that it is possible to insert only one carrier tape 5, and the like.

In the code identification step S31 of FIG. 9, the control computer or the job management computer 93 identifies the feeder specification code of the tape feeder F1 to F8 to which the carrier tape 5 will be loaded and the component type specification code of the components which are stored in the carrier tape 5. In this step, for example, the operator reads the feeder specification code which is given to the tape feeder F1 to F8 and the component type specification code which is given to the reel which is wound on the carrier tape 5 using the bar-code reader. Accordingly, the control computer or the job management computer 93 can identify the feeder specification code and the component type specification code through communication.

In the next positional precision reading step S32, the control computer or the job management computer 93 reads the positional precision of the tape feeder F1 to F8 which is specified by the identified by the feeder specification code from the positional precision data. In the next component type reading step S33, the control computer or the job management computer 93 reads at least one of the component external dimensions and the allowable positional precision of the component type which is specified by the identified component type specification code from the component type data.

In the next combination determination step S34, the control computer or the job management computer 93 determines the validity of the combination of the tape feeder F1 to F8 and the component type of the components which are stored in the carrier tape 5 based on the positional precision of the read tape feeder F1 to F8 and at least one of the component external dimensions and the allowable positional precision of the read component type. In other words, the control computer or the job management computer 93 determines that the combination is invalid when the combination is a vacant item or a D symbol indicated in FIG. 8.

When it is determined that the combination is invalid, the control computer or the job management computer 93 transmits a command to the tape feeder 32 to close the insertion port 32E. Accordingly, since the insertion port 32E of the tape feeder 32 is automatically closed, the operator cannot accidentally load an incorrect carrier tape 5. In step S35, the operator changes the reel and changes the carrier tape 5, and the process returns to the code identification step S31.

Meanwhile, when it is determined that the combination is valid, since the insertion port 32E of the tape feeder 32 is not closed, the operator can load the tip portion of the carrier tape 5 in the tape feeder 32. In step S36, it is determined whether or not the loading of the carrier tapes 5 to all of the tape feeders 32 has been completed. When the loading is incomplete, the process proceeds to step S37, and the operator transitions to the next tape feeder and returns to the code identification step S31. When the loading is completed in step S36, the process returns to step S10 of FIG. 7 and the production of the printed circuit board K is started.

The insertion port restriction mechanism can be adapted for the component refilling time determination step S13. In other words, in the component refilling time determination step S13, the control computer or the job management computer 93 transmits a command to the tape feeder 32 to half open the insertion port 32E when the combination of the tape feeder F1 to F8 and the component type P1 to P8 of the components which are stored in the next carrier tape 5 is determined to be invalid. Accordingly, the insertion port 32E of the tape feeder 32 opens half way and the operator can no longer accidentally load the next carrier tape 5 for which it is determined that the combination is invalid.

Note that, instead of the insertion port restriction mechanism, it is possible to adopt stopping control of the tape feed mechanism 35 of the tape feeder 32. In other words, the control section 37 of the tape feeder 32 performs control to stop the motor 351 of the tape feed mechanism 35 instead of stopping or half opening the insertion port 32E by controlling the insertion port restriction mechanism. Accordingly, the operator can re-load the next carrier tape 5 without the second sprocket 356 accidentally pulling in the next carrier tape 5 for which it is determined the combination is invalid.

The feeder component type determination method of the present embodiment determines combinations of the plurality of tape feeders F1 to F8 and the component types P1 to P8 of the components P which are stored in the carrier tapes 5 in the component mounting machine 1 provided with the component supply device 3 equipped, in a detachable manner, with the plurality of tape feeders 32 each of which holds the carrier tape 5 in which the plurality of components P is stored at the equal pitch Lp and sequentially supplies the components P to the corresponding supply position 32S, and the component transfer device 4 which sucks the component P which is supplied to the supply position 32S and mounts the component P to the printed circuit board K which is positioned in the mount-execution position, and the feeder component type determination method includes the positional precision measurement step S2 of measuring the positional precision at the supply position 32S of the supplied component P for at least a portion of the tape feeders F1 to F8, and the component type determination step S5 of determining the combinations of the plurality of tape feeders F5 to F8 and the component types P5 to P8 of the components P which are stored in the carrier tapes 5 based on the positional precision of the tape feeders F5 to F8 and at least one of the component external dimensions which are determined according to the component type P5 to P8 of the components P and the allowable positional precision when the components are supplied to the supply position 32S by the tape feeder 32.

Accordingly, in the positional precision measurement step S2, since the positional precision at the supply position 32S of the supplied component P is measured for at least a portion of the tape feeders F1 to F8, it is possible to individually and accurately ascertain the individual differences and the degradation with the passage of time in the positional precision of the supply position 32S of the tape feeders F5 to F8. In the component type determination step S5, combinations of the tape feeders F5 to F8 and the component types F5 to F8 of the components P which are stored in the carrier tapes 5 are determined based on the positional precision (the errors Er5 to Er8) of the tape feeders F5 to F8 and at least one of the component external dimensions and the allowable positional precision (the educated position errors Av5 to Av8) which are determined according to the component type P5 to P8 of the components P. In other words, it is possible to select the component types P5 to P8 with the correct component external dimensions and allowable positional precisions which are applicable to the positional precision of each of the tape feeders F5 to F8 are selected, and use the selected combinations. Accordingly, inappropriate combinations between the positional precisions of the tape feeders F5 to F8 and the component types F5 to F8 of the components P which are stored in the carrier tapes 5 are suppressed, and the suction operation of the components by the suction nozzle is stable. Therefore, it is possible to suppress the occurrence of suction faults in relation to the minute components which have a strict allowable positional precision, and the production efficiency of the printed circuit board K can be increased.

Note that, the cooperative work of the component mounting machine 1, the feeder inspection jig 91, the host computer 92, and the job management computer 93 is possible to carry out not only by the functional distribution in the embodiment described above, but also by various other embodiments, for example, it is possible to omit the host computer 92 and to cause the feeder inspection jig 91 or the job management computer 93 to also perform the tasks of the host computer 92. For example, it is not necessary to perform the component type determination step S5 with the job management computer 93, and the component type determination step S5 may be performed by another device which shares the positional precision data and the component type data. The control section 37 of the tape feeder 32 may store and hold the positional precision data of the control section 37 itself, and may transfer the positional precision data through communication when equipped to the component mounting machine 1.

It is possible to perform the measurement of the positional precision of the medium tape feeders F1 to F4 which are omitted in the specific example of FIG. 7 ant to optimize the combinations with the component types P1 to P4 of the four types of medium components. Four tape feeders may be selected and used based on the results of measuring the positional precision of five or more of the minute tape feeders. It is possible to apply various other adaptations and modifications to the present disclosure.

As the present embodiment, it is possible to provide the feeder component type determination method in which, in the component type determination step S2, the higher the positional precision of the tape feeder, the smaller the component external dimensions of the component type that is combined therewith, and the lower the positional precision of the tape feeder, the larger the component external dimensions of the component type that is combined therewith, and, alternatively the higher the positional precision of the tape feeder F5 to F8 (the smaller the errors Er5 to Er8), the stricter the allowable positional precision (the smaller the allowable position error Av5 to Av8) of the component type P5 to P8 that is combined therewith, and the lower the positional precision of the tape feeder F5 to F8, the more lenient the allowable positional precision of the component type P5 to P8 that is combined therewith.

Here, the allowable positional precision generally becomes stricter the smaller the component external dimensions of the component. In the present embodiment, it is possible to prioritize a combination of the eighth tape feeder F8 which has the highest positional precision and the component type P8 which has the smallest component external dimensions and the strictest allowable positional precision. Furthermore, hereinafter, it is possible to combine tape feeders with a high positional precision corresponding to the strictness of the allowable positional precision in the same manner. Therefore, the margins of the positional precision in each combination of the tape feeders F5 to F8 and the component types P5 to P8 is comparatively averaged, and no combinations arise in which the margin is excessively small. Accordingly, inappropriate combinations between the positional precisions of the tape feeders F5 to F8 and the component types F5 to F8 of the components P which are stored in the carrier tapes 5 do not arise, and the suction operation of the components by the suction nozzle is stable.

As the present embodiment, it is possible to provide the feeder component type determination method in which the component type determination step S5 includes a poor precision avoidance step of avoiding a combination of the tape feeder F5 and the component types P7 and P8 when the allowable positional precision (the allowable position errors av7 and Av8) determined according to the component type P7 and P8 of the components P is stricter than the positional precision (the error Er5) of the tape feeder F5.

Accordingly, it is possible to reliably avoid a precision mismatch in which the positional precision of the tape feeder F5 is lower than the allowable positional precision of the component types P7 and P8, and the suction operation of the components by the suction nozzle is reliably stable.

As the present embodiment, it is possible to provide the feeder component type determination method in which, following the positional precision measurement step S2, the feeder component type determination method further includes a positional precision storage step S3 of storing positional precision data in which a feeder specification code which specifies the tape feeder 32 for which the measurement is performed is associated with the positional precision, and a component type data storage step S4 of storing component type data in which a component type specification code which specifies a component type of the components is associated with at least one of component external dimensions of the component type and an allowable positional precision, and in which, in the component type determination step S5, combinations of the plurality of tape feeders F5 to F8 and the component types P5 to P8 of the components P which are stored in the carrier tapes 5 are determined based on the positional precision data and the component type data.

Accordingly, it is possible to automatically perform the component type determination step S5 with the job management computer 93. Therefore, the work of the operator is greatly reduced, and the production efficiency of the printed circuit board K can be increased.

As the present embodiment, it is possible to provide the feeder component type determination method in which, following the component type determination step S5, the feeder component type determination method further includes a code identification step S31 of identifying a feeder specification code of the tape feeder 32 and a component type specification code of the components P which are stored in the carrier tape 5 when loading the carrier tape 5 in the tape feeder 32, a positional precision reading step S32 of reading a positional precision of the tape feeder 32 which is specified by the identified feeder specification code from the positional precision data, a component type reading step S33 of reading at least one of the component external dimensions and the allowable positional precision of the component type which is specified by the identified component type specification code from the component type data, and a combination determination step S34 of determining validity of a combination of the tape feeder 32 and the component type of the components P which are stored in the carrier tape 5 based on the positional precision of the tape feeder 32 which is read and at least one of the component external dimensions and the allowable positional precision of the component type which is read.

Accordingly, it is possible to automatically perform the validity of the combinations of the tape feeders 32 and the component types of the components P which are stored in the carrier tapes 5 with the job management computer 93. Therefore, the concern that the operator will load an inappropriate carrier tape 5 in the tape feeder 32 is suppressed, and the production efficiency of the printed circuit board K can be increased.

As the present embodiment, it is possible to provide the feeder component type determination method in which, using a next-tape-loading tape feeder 32 capable of sequentially supplying the components P which are stored in the carrier tape 5 which is in use to the supply position 32S and capable of loading a tip portion 5T of the next carrier tape 5 to a preparation position (the cutout holding section 362K of the bottom face of the first pressing member 362), when the allowable positional precision which is determined according to the component type of the components which are stored in the next carrier tape 5 is stricter than the positional precision of the next-tape-loading tape feeder 32, the poor precision avoidance step avoids loading the tip portion of the next carrier tape 5 to the preparation position of the next-tape-loading tape feeder.

Accordingly, in the configuration using the next-tape-loading tape feeder 32, since the insertion port 32E is half opened when the next carrier tape 5 is a precision mismatch, the operator may no longer accidentally load the next carrier tape 5. Therefore, the production efficiency of the printed circuit board K can be increased.

As the present embodiment, it is possible to provide the feeder component type determination method in which the feeder component type determination method is executed when a state in which each of the tape feeders 32 is capable of supplying the components P of each of the component types to the respective supply positions 32S is set up by loading carrier tapes 5, in which the components P of the component types corresponding to the positions of the plurality of tape feeders 32 equipped to the component supply device 3 are stored, in each of the tape feeders 32.

Accordingly, the present disclosure is carried out when performing the intra-machine set-up step S8, and the production efficiency of the printed circuit board K can be increased.

As the present embodiment, It is possible to provide the feeder component type determination method in which the feeder component type determination method is executed when set-up is performed such that each of the tape feeders 32 is set to a state of being capable of supplying the components to the respective supply positions 32S by loading the carrier tapes 5 in the plurality of tape feeders 32 at a location separated from the component mounting machine 1, and an arrangement order of the tape feeders 32 is sorted on the support table 31.

Accordingly, the present disclosure is carried out when performing the extra-machine set-up step S9, and the production efficiency of the printed circuit board K can be increased.

As the present embodiment, it is possible to provide the feeder component type determination method which further includes a component refilling time determination step S13 of determining validity of a combination of the positional precision of the tape feeder and at least one of the component external dimensions and the allowable positional precision which are determined according to the component type of the components P which are stored in the next carrier tape 5 when loading the next carrier tape 5 in which components of the same component type are stored is loaded in the tape feeder 32 in which the carrier tape 5 which has run out of components is loaded in the middle of the component mounting machine 1 producing the printed circuit board K.

Accordingly, when refilling the components during the production of the printed circuit board K, the occurrence of the next carrier tape 5 being accidentally loaded when the combination of the tape feeder 32 and the component type of the next carrier tape 5 is invalid is eliminated. Therefore, the production efficiency of the printed circuit board K can be increased.

As the present embodiment, it is possible to provide a feeder component type determination device which determines combinations of a plurality of tape feeders 32 and a plurality of component types of components P which are stored in carrier tapes 5 in a component mounting machine 1 provided with a component supply device 3 equipped, in a detachable manner, with the plurality of tape feeders 32 each of which holds a carrier tape 5 in which the plurality of components P is stored at an equal pitch Lp and sequentially supplies the components P to a corresponding supply position 32S, and a component transfer device 4 which sucks the component P which is supplied to the supply position 32S and mounts the component to a printed circuit board K which is positioned in a mount-execution position, the feeder component type determination device including a feeder inspection jig 91 which measures a positional precision at the supply position 32S of the supplied components P for at least a portion of the tape feeders F1 to F8, and a job management computer 93 which determines the combinations of the tape feeders F5 to F8 and the component types P5 to P8 of the components P which are stored in the carrier tapes 5 based on the positional precision (the errors Er5 to Er8) of the tape feeders F5 to F8 and at least one of component external dimensions which are determined according to the component type P5 to P8 of the components P and an allowable positional precision (the allowable position errors Av5 to Av8) when the components are supplied to the supply position 32S by the tape feeder 32.

Accordingly, it is possible to carry out the present embodiment as a device, and the effects of the feeder component type determination method previously provided arise.

REFERENCE SIGNS LIST

1: component mounting machine, 2: board conveyance device, 3: component supply device, 31: support table, 32: tape feeder, 32E: insertion port, 32S: supply position, 33: feeder housing, 34: rail, 35: tape feed mechanism, 36: next-tape control mechanism, 37: control section, 39: reel holding section, 4: component transfer device, 5: carrier tape, 5T: tip portion, 51: base tape, 511: recessed accommodation portion, 52: cover tape, 53: bottom tape, 6: measurement tape, 61: measurement marker, 8: device table, 91: feeder inspection jig, 911: support table, 912: communication socket, 913: imaging camera, 914: jig control section, 92: host computer, 93: job management computer, K; printed circuit board, P: component, Lp: pitch.

The invention claimed is:

1. A feeder component type determination method which determines combinations of a plurality of tape feeders and a plurality of component types of components which are stored in carrier tapes in a component mounting machine provided with a component supply device equipped, in a detachable manner, with the plurality of tape feeders each of which holds a carrier tape in which the plurality of components is stored at an equal pitch and sequentially supplies the components to a corresponding supply position, and a component transfer device which sucks the component which is supplied to the supply position and mounts the component to a printed circuit board which is positioned in a mount-execution position, the feeder component type determination method comprising:
   a positional precision measurement step of measuring a positional precision at the supply position for at least a portion of the tape feeders; and
   a component type determination step of determining the combinations of the tape feeders and the component types of the components which are stored in the carrier tapes based on the positional precision of the tape feeders and at least one of component external dimensions which are determined according to the component type of the components and an allowable positional precision when the components are supplied to the supply position by the tape feeder,
   wherein in the component type determination step the higher the positional precision of the tape feeder, the stricter the allowable positional precision of the component type that is combined therewith, and the lower the positional precision of the tape feeder, the more lenient the allowable positional precision of the component type that is combined therewith.

2. The feeder component type determination method according to claim 1,
   wherein, in the component type determination step,
   the higher the positional precision of the tape feeder, the smaller the component external dimensions of the component type that is combined therewith, and the lower the positional precision of the tape feeder, the larger the component external dimensions of the component type that is combined therewith.

3. The feeder component type determination method according to claim 1,
   wherein the component type determination step includes a poor precision avoidance step of avoiding a combination of the tape feeder and the component type when the allowable positional precision determined according to the component type of the components is stricter than the positional precision of the tape feeder.

4. A feeder component type determination method which determines combinations of a plurality of tape feeders and a plurality of component types of components which are stored in carrier tapes in a component mounting machine provided with a component supply device equipped, in a detachable manner, with the plurality of tape feeders each of which holds a carrier tape in which the plurality of components is stored at an equal pitch and sequentially supplies the components to a corresponding supply position, and a component transfer device which sucks the component which is supplied to the supply position and mounts the component to a printed circuit board which is positioned in a mount-execution position, the feeder component type determination method comprising:
   a positional precision measurement step of measuring a positional precision at the supply position for at least a portion of the tape feeders; and
   a component type determination step of determining the combinations of the tape feeders and the component types of the components which are stored in the carrier tapes based on the positional precision of the tape feeders and at least one of component external dimensions which are determined according to the component type of the components and an allowable positional precision when the components are supplied to the supply position by the tape feeder,
   wherein, following the positional precision measurement step, the feeder component type determination method further comprises:
   a positional precision storage step of storing positional precision data in which a feeder specification code which specifies the tape feeder for which the measurement is performed is associated with the positional precision; and
   a component type data storage step of storing component type data in which a component type specification code which specifies a component type of the components is associated with at least one of component external dimensions of the component type and an allowable positional precision, and
   wherein, in the component type determination step, combinations of the plurality of tape feeders and the component types of the components which are stored in the carrier tapes are determined based on the positional precision data and the component type data.

5. The feeder component type determination method according to claim 4,
   wherein, following the component type determination step, the feeder component type determination method further comprises:
   a code identification step of identifying a feeder specification code of the tape feeder and a component type specification code of the components which are stored in the carrier tape when loading the carrier tape in the tape feeder;
   a positional precision reading step of reading a positional precision of a tape feeder which is specified by the identified feeder specification code from the positional precision data;
   a component type reading step of reading at least one of the component external dimensions and the allowable positional precision of the component type which is specified by the identified component type specification code from the component type data; and
   a combination determination step of determining validity of a combination of the tape feeder and the component type of the components which are stored in the carrier tape based on the positional precision of the tape feeder which is read and at least one of the component external dimensions and the allowable positional precision of the component type which is read.

6. The feeder component type determination method according to claim 5,
wherein, using a next-tape-loading tape feeder capable of sequentially supplying the components which are stored in the carrier tape which is in use to the supply position and capable of loading a tip portion of the next carrier tape to a preparation position,
when the allowable positional precision which is determined according to the component type of the components which are stored in the next carrier tape is stricter than the positional precision of the next-tape-loading tape feeder, the poor precision avoidance step avoids loading the tip portion of the next carrier tape to the preparation position of the next-tape-loading tape feeder.

7. The feeder component type determination method according to claim 1,
wherein the feeder component type determination method is executed when a state in which each of the tape feeders is capable of supplying the components of each of the component types to the respective supply positions is set up by loading carrier tapes, in which the components of the component types corresponding to the positions of the plurality of tape feeders equipped to the component supply device are stored, in each of the tape feeders.

8. The feeder component type determination method according to claim 1,
wherein the feeder component type determination method is executed when set-up is performed such that each of the tape feeders is set to a state of being capable of supplying the components to the respective supply positions by loading the carrier tapes in the plurality of tape feeders at a location separated from the component mounting machine, and an arrangement order of the tape feeders is sorted.

9. The feeder component type determination method according to claim 1, further comprising:
a component refilling time determination step of determining validity of a combination of the positional precision of the tape feeder and at least one of the component external dimensions and the allowable positional precision which are determined according to the component type of the components which are stored in the next carrier tape when loading the next carrier tape in which components of the same component type are stored is loaded in the tape feeder in which the carrier tape which has run out of components is loaded in the middle of the component mounting machine producing the printed circuit board.

10. A feeder component type determination device which determines combinations of a plurality of tape feeders and a plurality of component types of components which are stored in carrier tapes in a component mounting machine provided with a component supply device equipped, in a detachable manner, with the plurality of tape feeders each of which holds a carrier tape in which the plurality of components is stored at an equal pitch and sequentially supplies the components to a corresponding supply position, and a component transfer device which sucks the component which is supplied to the supply position and mounts the component to a printed circuit board which is positioned in a mount-execution position, the feeder component type determination device comprising:
positional precision measuring device for measuring a positional precision at supply position for at least a portion of the tape feeders; and
component type determination device for determining the combinations of the tape feeders and the component types of the components which are stored in the carrier tapes based on the positional precision of the tape feeders and at least one of component external dimensions which are determined according to the component type of the components and an allowable positional precision when the components are supplied to the supply position by the tape feeder.
wherein the higher the positional precision of the tape feeder, the stricter the allowable positional precision of the component type that is combined therewith, and the lower the positional precision of the tape feeder, the more lenient the allowable positional precision of the component type that is combined therewith.

11. The feeder component type determination device according to claim 10, further comprising:
a component refilling time determination device of determining validity of a combination of the positional precision of the tape feeder and at least one of the component external dimensions and the allowable positional precision which are determined according to the component type of the components which are stored in the next carrier tape when loading the next carrier tape in which components of the same component type are stored is loaded in the tape feeder in which the carrier tape which has run out of components is loaded in the middle of the component mounting machine producing the printed circuit board.

12. The feeder component type determination device according to claim 10, further comprising:
a positional precision storage device of storing positional precision data in which a feeder specification code which specifies the tape feeder for which the measurement is performed is associated with the positional precision; and
a component type data storage device of storing component type data in which a component type specification code which specifies a component type of the components is associated with at least one of component external dimensions of the component type and an allowable positional precision, and
wherein combinations of the plurality of tape feeders and the component types of the components which are stored in the carrier tapes are determined based on the positional precision data and the component type data.

* * * * *